(12) United States Patent
Ferriss et al.

(10) Patent No.: US 9,998,073 B2
(45) Date of Patent: Jun. 12, 2018

(54) FORMING A FREQUENCY CONTROL COMPONENT WITH A TARGET EFFECTIVE CAPACITANCE RANGE

(71) Applicant: International Business Machines Corporation, Armonk, NY (US)

(72) Inventors: Mark A. Ferriss, Tarrytown, NY (US); Daniel J. Friedman, Sleepy Hollow, NY (US); Bodhisatwa Sadhu, White Plains, NY (US); Alberto Valdes-Garcia, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 217 days.

(21) Appl. No.: 14/791,621

(22) Filed: Jul. 6, 2015

(65) Prior Publication Data

US 2016/0204765 A1    Jul. 14, 2016

Related U.S. Application Data

(63) Continuation of application No. 14/731,593, filed on Jun. 5, 2015, now Pat. No. 9,401,696.
(Continued)

(51) Int. Cl.
*H01L 27/108* (2006.01)
*H03B 7/06* (2006.01)
(Continued)

(52) U.S. Cl.
CPC .............. *H03B 7/06* (2013.01); *H03B 5/124* (2013.01); *H03B 5/1206* (2013.01);
(Continued)

(58) Field of Classification Search
CPC ........ H03B 2200/004; H03B 2200/009; H03B 2201/0216; H03B 5/1206; H03B 5/1215;
(Continued)

(56) References Cited

U.S. PATENT DOCUMENTS 4,048,598 A * 9/1977 Knight .................... H03J 3/185
                                                          333/32
5,965,912 A * 10/1999 Stolfa ..................... H01L 29/94
                                                          257/312
(Continued)

OTHER PUBLICATIONS

A.D. Berny et al., "A 1.8-GHz LC VCO With 1.3-GHz Tuning Range and Digital Amplitude Calibration," IEEE Journal of Solid-State Circuits (JSSC), Apr. 2005, pp. 909-917, vol. 40, No. 4.
(Continued)

*Primary Examiner* — Minh Trinh
(74) *Attorney, Agent, or Firm* — Vazken Alexanian; Ryan, Mason & Lewis, LLP

(57) ABSTRACT

A voltage controlled oscillator comprises a negative resistance, a first inductor, a fixed capacitor, and a frequency control component. The frequency control component comprises at least one varactor and at least a second inductor connected in series with the at least one varactor. A magnitude of an inductance of the second inductor is selected such that the frequency control component has an effective capacitance range larger than a capacitance range of the at least one varactor.

20 Claims, 11 Drawing Sheets

Related U.S. Application Data

(60) Provisional application No. 62/101,541, filed on Jan. 9, 2015.

(51) Int. Cl.
| | | |
|---|---|---|
| *H03J 3/18* | (2006.01) | |
| *H03J 3/20* | (2006.01) | |
| *H03J 3/22* | (2006.01) | |
| *H03B 5/12* | (2006.01) | |
| *H03J 5/02* | (2006.01) | |
| *H03L 7/099* | (2006.01) | |

(52) U.S. Cl.
CPC ......... *H03B 5/1215* (2013.01); *H03B 5/1225* (2013.01); *H03B 5/1228* (2013.01); *H03B 5/1243* (2013.01); *H03B 5/1265* (2013.01); *H03J 3/185* (2013.01); *H03J 3/20* (2013.01); *H03J 3/22* (2013.01); *H03J 5/0218* (2013.01); *H03L 7/099* (2013.01); *H03B 2200/004* (2013.01); *H03B 2200/009* (2013.01); *H03B 2201/0216* (2013.01); *H03J 2200/10* (2013.01); *H03L 7/0991* (2013.01)

(58) Field of Classification Search
CPC .... H03B 5/1225; H03B 5/1228; H03B 5/124; H03B 5/1243; H03B 5/1265; H03B 7/06
See application file for complete search history.

(56) References Cited

U.S. PATENT DOCUMENTS

| | | | | |
|---|---|---|---|---|
| 6,678,511 B2 * | 1/2004 | Hwang | ................ | H03H 7/0115 455/307 |
| 8,698,570 B2 * | 4/2014 | Afshari | ................. | H03B 19/00 330/286 |
| 8,954,773 B2 * | 2/2015 | Scott | ......................... | G06F 1/08 713/300 |
| 9,203,416 B2 * | 12/2015 | Rozenblit | ................. | H03L 7/08 |
| 9,401,696 B1 * | 7/2016 | Ferriss | ................. | H03B 5/1225 |
| 2014/0347105 A1 * | 11/2014 | Rozenblit | ................. | H03L 7/08 327/156 |

OTHER PUBLICATIONS

B. Sadhu et al., "A CMOS 3.3-8.4 GHz Wide Tuning Range, Low Phase Noise LC VCO," IEEE Custom Integrated Circuits Conference (CICC), Sep. 2009, pp. 559-562.

B. Sadhu et al., "A 3-Band Switched-Inductor LC VCO and Differential Current Re-Use Doubler Achieving 0.7-to-11.6 GHz Tuning Range," IEEE Radio Frequency Integrated Circuits Symposium (RFIC), May 2015, pp. 191-194.

M. Kossel et al., "LC PLL With 1.2-Octave Locking Range Based on Mutual-Inductance Switching in 45-nm SOI CMOS," IEEE Journal of Solid-State Circuits (JSSC), Feb. 2009, pp. 436-449, vol. 44, No. 2.

S. Saberi et al., "A 11.5-22GHz Dual-Resonance Transformer-Coupled Quadrature VCO," IEEE Radio Frequency Integrated Circuits Symposium (RFIC), Jun. 2011, pp. 1-4.

Q. Wu et al., "A—189 dBc/Hz FOMT Wide Tuning Range Ka-band VCO Using Tunable Negative Capacitance and Inductance Redistribution," IEEE Radio Frequency Integrated Circuits Symposium (RFIC), Jun. 2013, pp. 199-202.

M. Ferriss et al., "A 13.1-to-28GHz Fractional-N. PLL in 32nm SOI CMOS with a ΔΣ Noise-Cancellation Scheme," International Solid-State Circuits Conference (ISSCC), Feb. 2015, pp. 1-3.

B. Sadhu et al., "Capacitor Bank Design for Wide Tuning Range LC VCOs: 850MHz-7.1 GHz (157%)," IEEE International Symposium on Circuits and Systems (ISCAS), May-Jun. 2010, pp. 1975-1978, Paris, France.

W.H. Woods et al., "CMOS Millimeter Wave Phase Shifter Based on Tunable Transmission Lines," IEEE Custom Integrated Circuits Conference (CICC), Sep. 2013, pp. 1-4.

List of IBM Patents or Patent Applications Treated as Related.

* cited by examiner

FORMING A FREQUENCY CONTROL COMPONENT WITH A TARGET EFFECTIVE CAPACITANCE RANGE

CROSS-REFERENCE TO RELATED APPLICATION

This application is a Continuation of U.S. patent application Ser. No. 14/731,593, filed on Jun. 5, 2015 and issued on Jul. 26, 2016 as U.S. Pat. No. 9,401,696, which claims the benefit of U.S. Provisional Patent Application Ser. No. 62/101,541, filed on Jan. 9, 2015, the disclosure of which is fully incorporated by reference herein. The disclosures of these applications are incorporated by reference herein.

STATEMENT REGARDING FEDERALLY SPONSORED RESEARCH

This invention was made with Government support under Contract No.: HR0011-12-C-0087 awarded by the Defense Advanced Research Projects Agency (DARPA). The Government has certain rights in this invention.

BACKGROUND

Reconfigurable radios are used for various applications. Some reconfigurable radios use oscillators, which often include an inductor, a capacitor, a negative resistance element to maintain oscillation and a variable capacitor or varactor for controlling the frequency of the oscillator. An oscillator controlled with a digital control word is referred to as a digitally controlled oscillator (DCO). An oscillator controlled with an analog control voltage is referred to as a voltage controlled oscillator (VCO).

SUMMARY

Embodiments of the invention provide techniques for boosting a capacitance ratio of a varactor.

In one embodiment, a method comprises selecting a target effective maximum to minimum capacitance range for a frequency control component comprising at least one varactor, the target effective capacitance range for the frequency control component being larger than a capacitance range of the at least one varactor, forming the frequency control component by providing at least one inductor in series with the at least one varactor, and selecting a magnitude of an inductance of the at least one inductor such that the frequency control component has the target effective capacitance range.

In another embodiment, an apparatus comprises a frequency control component comprising at least one varactor and at least one inductor connected in series with the at least one varactor. A magnitude of an inductance of the at least one inductor is selected such that the frequency control component has an effective capacitance range larger than a capacitance range of the at least one varactor.

In another embodiment, a voltage controlled oscillator comprises a negative resistance, a first inductor, a fixed capacitor and a frequency control component. The frequency control component comprises at least one varactor and at least a second inductor connected in series with the at least one varactor. A magnitude of an inductance of the second inductor is selected such that the frequency control component has an effective capacitance range larger than a capacitance range of the at least one varactor.

These and other features, objects and advantages of the present invention will become apparent from the following detailed description of illustrative embodiments thereof, which is to be read in connection with the accompanying drawings.

DETAILED DESCRIPTION

Illustrative embodiments of the invention will be described herein in the context of reconfigurable radio systems including an oscillator. However, it is to be understood that principles of the invention are not limited solely to the specific architectures described herein. For example, the inventive techniques can be used in a number of other types of circuits including microprocessors, mm-wave radios, serial links, resonators, filters, etc.

In order to design reconfigurable radios that cover a wide tuning range and meet a variety of specifications, it is desirable to have a wide-tuning VCO with good phase noise performance and low power consumption across the entire target tuning range. Ring oscillators can achieve a very wide tuning range, but they typically have poor phase noise and, when operated at near-mm-wave frequencies, demand significant power. In addition to a wide tuning range VCO, a goal of flexible reconfigurability can be achieved by embedding a VCO within a fractional-N frequency synthesizer that can lock to any desired frequency in the tuning range of the VCO using any given reference frequency within a reasonable range.

Achieving a large tuning range at high frequencies is challenging in LC oscillators. Wide-tuning tank-based VCOs at the sib-10 GHz frequency range may be achieved using a variety of techniques, including using capacitive tuning for frequencies below 2 GHz and inductor tuning in switched inductors and magnetically tuned VCOs below 10 GHz. Wide-tuning range solutions which use large capacitor arrays and multi-mode inductors and transforms effectively produce higher order tanks that are susceptible to parasitic modes of oscillation. Multi-tank and/or multi-VCO arrangements may be used to cover an entire tuning range, but at the expense of area and complexity. In some embodiments, a full-octave VCO having a frequency range above 15 GHz is achieved overcoming one or more of the above-noted drawbacks.

In some embodiments, techniques are used to increase an effective capacitance ratio of a varactor, thereby enabling a wider tuning range using capacitive tuning. In some embodiments, series interconnect inductance is used to enhance the capacitance and effective capacitance ratio of a varactor, enabling the creation of a large tuning range oscillator at high frequencies. A tradeoff between the quality factor of the varactor and the tuning range may be optimized in some embodiments to achieve good phase noise performance across the tuning range. Further, in some embodiments transconductance distribution techniques are utilized to avoid parasitic oscillations arising from a resulting higher order tank to achieve high start-up gain for a desired oscillation mode and low gain for one or more parasitic modes.

Figure 1:
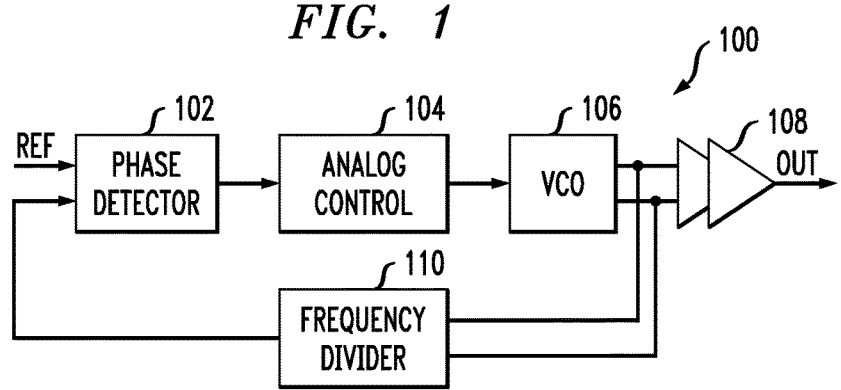
FIG. 1 shows an analog phase-locked loop (PLL) architecture, according to an embodiment of the invention.

FIG. 1 shows an analog PLL 100, which may be used in a synthesizer or other reconfigurable radio system. The analog PLL 100 includes a phase detector 102, analog control 104, VCO 106, driver 108 and frequency divider 110. The phase detector 102 detects a phase difference between a reference signal, denoted Ref in FIG. 1 and the output of the frequency divider 110. The frequency divider 110 divides the output frequency of the VCO 106 to provide frequency scaling. The output of the phase detector 102 is input to analog control 104, which controls the VCO 106 so as to match the divided output of the VCO 106 with the reference signal Ref.

Figure 2:
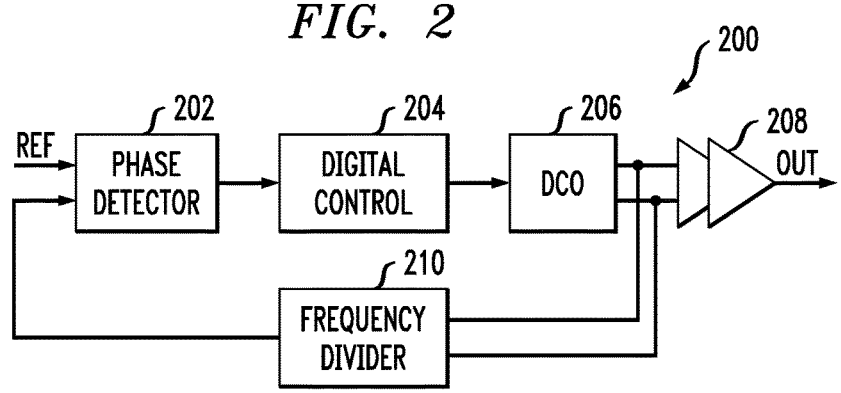
FIG. 2 shows a digital PLL architecture, according to an embodiment of the invention.

FIG. 2 shows a digital PLL 200, including a phase detector 202, digital control 204, DCO 206, driver 208 and frequency divider 210, which function in a manner similar to that described above with respect to the phase detector 102, digital control 104, VCO 106, driver 108 and frequency divider 110 of the analog PLL 100.

Figure 3:
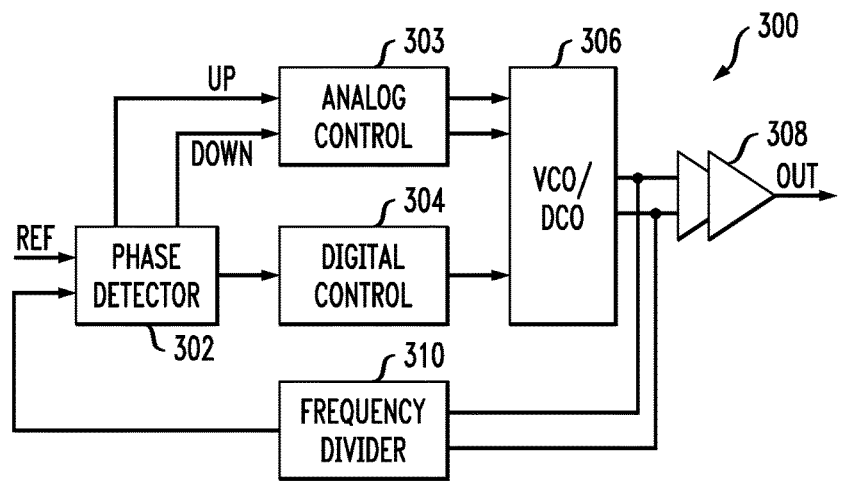
FIG. 3 shows a hybrid PLL architecture, according to an embodiment of the invention.

FIG. 3 shows a hybrid PLL 300. The hybrid PLL 300 includes phase detector 302, analog control 303, digital control 304, VCO/DCO 306, driver 308 and frequency divider 310. The phase detector 302 detects a phase difference between the output of the frequency divider 310 and the reference signal Ref. The phase detector 302 in the hybrid PLL 300 provides outputs to both analog control 303 and digital control 304. Analog control 303 controls the VCO portion of VCO/DCO 306 while the digital control 304 controls the DCO portion of VCO/DCO 306. The hybrid PLL 300 may be an integer-N hybrid PLL or a fractional-N hybrid PLL. In fractional-N mode a noise cancellation scheme removes the error introduced by a delta-sigma divider. The hybrid PLL 300 may be implemented using a 32 nm silicon on insulator (SOI) complementary metal-oxide-semiconductor (CMOS) process.

In the analog PLL 100, digital PLL 200 and hybrid PLL 300, one or more the analog/digital controls and VCO/DCO may include a frequency control component using a series inductor to enhance the capacitance and effective capacitance ratio of at least one varactor. Various examples of the frequency control components will be described in further detail below.

The analog PLL 100, digital PLL 200 and hybrid PLL 300 may each feature full-octave tuning cross coupled VCO, DCO or VCO/DCO with a continuous tuning range. Frequencies below the VCO, DCO or VCO/DCO output frequencies can be obtained using frequency dividers. In some embodiments, the tuning range is between approximately 10.5 GHz and 24 GHz. The divider 108 in analog PLL 100, divider 208 in digital PLL 200 and divider 308 in hybrid PLL 300 may feature programmable div/2 to div/16 output dividers providing outputs down to the sub-1 GHz range in some embodiments. A single capacitively tuned LC VCO, DCO or VCO/DCO may be used to achieve the full-octave tuning range.

In some embodiments, it is desirable to enable synthesis of any frequency between 1 GHz and 24 GHz using a single VCO and output dividers. To achieve this, the VCO must support more than one octave of tuning range natively. Once this range is achieved, output division can be used to reach frequencies below the lowest direct frequency to which the VCO can be tuned. However, obtaining an octave of tuning range in an LC tank oscillator is challenging, primarily because parasitic capacitances form a significant component of tank capacitance. This is true especially in advanced technology processes, placing significant demands on varactor capacitance ratios using traditional techniques. In order to achieve the target tuning range, capacitance enhancement techniques are used in some embodiments. The capacitance enhancement techniques may leverage interconnect inductance of a capacitor array to achieve improvements. As described above, in some embodiments transconductance distribution techniques may be utilized to avoid parasitic oscillations resulting from the higher order tank.

Figure 4:
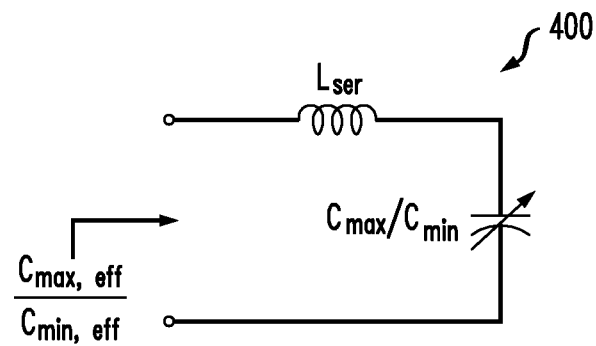
FIG. 4 shows a varactor using a series inductance to boost capacitance ratio, according to an embodiment of the invention.
Figure 5:
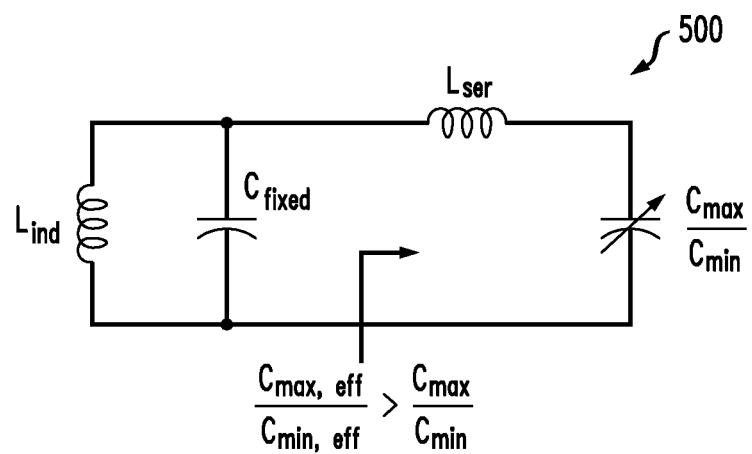
FIG. 5 shows an LC tank using a series inductance to boost a capacitance ratio of a varactor, according to an embodiment of the invention.

FIG. 4 shows a structure 400 including a varactor with a capacitance ratio $C_{max}/C_{min}$ and an inductor $L_{ser}$ placed in series with the varactor. FIG. 5 shows a structure 500 similarly including a varactor and an inductor $L_{ser}$ placed in series with the varactor. The structure 500 further includes a fixed capacitor having a fixed capacitance $C_{fixed}$. When inductor $L_{ser}$ is placed in series with the variable capacitor as shown in FIG. 4, the capacitance of the structure 400 is modified according to the following equation $$\frac{1}{C_{var,eff}} = \frac{1}{C_{var}} - \omega_{osc}^2 L_{ser} \quad (1)$$

where $C_{var}$ is the capacitance of the variable capacitor, $C_{var,eff}$ is the effective capacitance of the variable capacitance, and $\omega_{osc}$ is the frequency of oscillation, where $$\omega_{osc} < \frac{1}{\sqrt{L_{ser} C_{var}}}.$$

The effective capacitance of the varactor in structure 500 is similarly modified.

The new ratio of capacitances is given as:

$$\frac{C_{max,eff}}{C_{min,eff}} = \frac{C_{max}(1 - C_{min}\omega_{osc}^2 L_{ser})}{C_{min}(1 - C_{max}\omega_{osc}^2 L_{ser})} \quad (2)$$

where $C_{max}$ and $C_{min}$ denote the maximum and minimum capacitances of the variable capacitor and $C_{max,eff}$ and $C_{min,eff}$ denote the effective maximum and effective minimum capacitances of the structure 400. Since $C_{min} < C_{max}$, the new capacitance ratio is larger than the original ratio, i.e., $$\frac{C_{max,eff}}{C_{min,eff}} > \frac{C_{max}}{C_{min}}.$$

It is assumed, at this point, that $\omega_{osc}$ does not change significantly compared to the total tuning range. This varactor ratio boosting technique does not have any significant area penalty, and can be made more pronounced by choosing a value of $L_{ser}$ such that $C_{max}\omega_{osc}^2 L_{ser}$ approaches unity.

The series inductor $L_{ser}$ may be implemented as a coil inductor, using interconnect wiring, using a tunable or variable inductor, using a transmission line, or using a tunable or variable transmission line. In embodiments where $L_{ser}$ is implemented using interconnect wiring the value of the inductance of $L_{ser}$ may be chosen by adjusting the length and/or width of the interconnect wiring. The value of the inductance of $L_{ser}$ may additionally or alternatively be chosen by varying a distance between a given interconnect wiring and one or more other interconnect wirings carrying a current having the same or opposite polarity. If the given interconnect wiring and the other interconnect wiring carry current having the same polarity, the interconnect inductance increases due to the mutual inductance effect. If the given interconnect wiring and the other interconnect wiring carry current have the opposite polarity, the interconnect inductance decreases.

Figure 6:
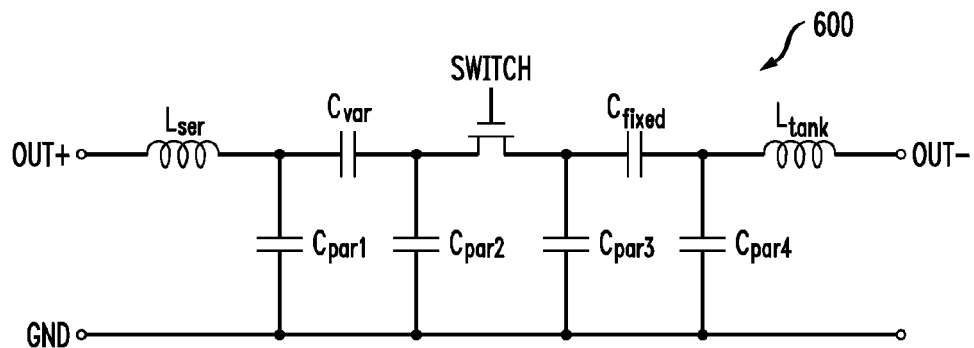
FIG. 6 shows a switched capacitor circuit, according to an embodiment of the invention.

Moreover, some embodiments may be designed having a net improvement in varactor Q while also achieving varactor enhancement. For example, in the structure 500, the varactor may be implemented as a switched capacitor. FIG. 6 shows a structure 600, where the varactor is implemented as a switched capacitor. The structure 600 includes varactor $C_{var}$ connected in series with inductance $L_{ser}$. The structure 600 further includes a switch, a fixed capacitor $C_{fixed}$, a tank inductor $L_{tank}$ and a number of parasitic capacitances denoted $C_{par1}$-$C_{par4}$. The switch resistance is assumed to dominate over inductor and metal-oxide-metal capacitance (MOMCAP) parasitic resistances.

The reduction in Q of the varactor can be compensated for by using a larger switch in the structure 600. In some embodiments, the Q of the varactor may be improved by using the larger switch. In an advanced 32 nm CMOS SOI technology, the $C_{max}/C_{min}$ ratio of the MOMCAPs varies between <2:1 for small capacitors to about 10:1 for large capacitors. Small capacitors in this advanced technology may have, by way of example, capacitances of approximately 10 femto farads (fF), while large capacitors in this advanced technology may have, by way of example, capacitances of approximately 200 fF. Given the small capacitors used at high frequencies to keep analog tuning and resulting VCO gain low, it is difficult or impossible to achieve a sufficiently high $C_{max}/C_{min}$ ratio, especially after the addition of a switch. Note that for an octave of tuning, an overall $(C_{max}+C_{fixed})/(C_{min}+C_{fixed}) > 4$ is needed.

Figure 7:
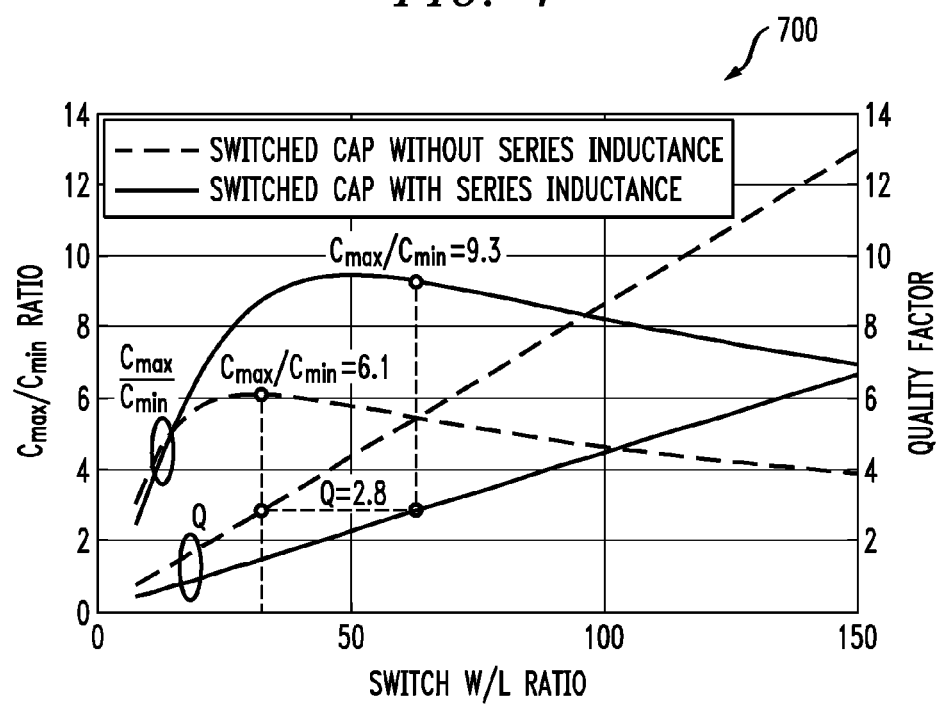
FIG. 7 shows a plot of capacitance ratio enhancement and Q factor, according to an embodiment of the invention.

FIG. 7 shows a plot 700 of capacitance ratio enhancement and Q factor for the structure 600. The $C_{max}/C_{min}$ of the structure 600 with an ideal switch and $L_{ser}=0$ is set as 10:1. The size of a real switch in the 32 nm CMOS SOI technology is varied to evaluate the Q factor versus $C_{max}/C_{min}$ tradeoff. As shown in the plot 700, for a given Q factor, the capacitance enhancement technique (where $L_{ser} > 0$) achieves a much higher tuning range. Without the use of the series inductor, a peak $C_{max}/C_{min}$ ratio of (6.1):1 is obtained. For this ratio, the Q factor is 2.8. In the presence of series inductance, the $C_{max}/C_{min}$ ratio improves to about (9.5):1, at the cost of Q. However, as shown in the plot 700, for the same Q factor, a $C_{max}/C_{min}$ ratio of (9.3):1 is still obtained by increasing the size of the switch. The lower Q factor is offset by using a larger switch, while still maintaining an overall advantage.

Figure 8:
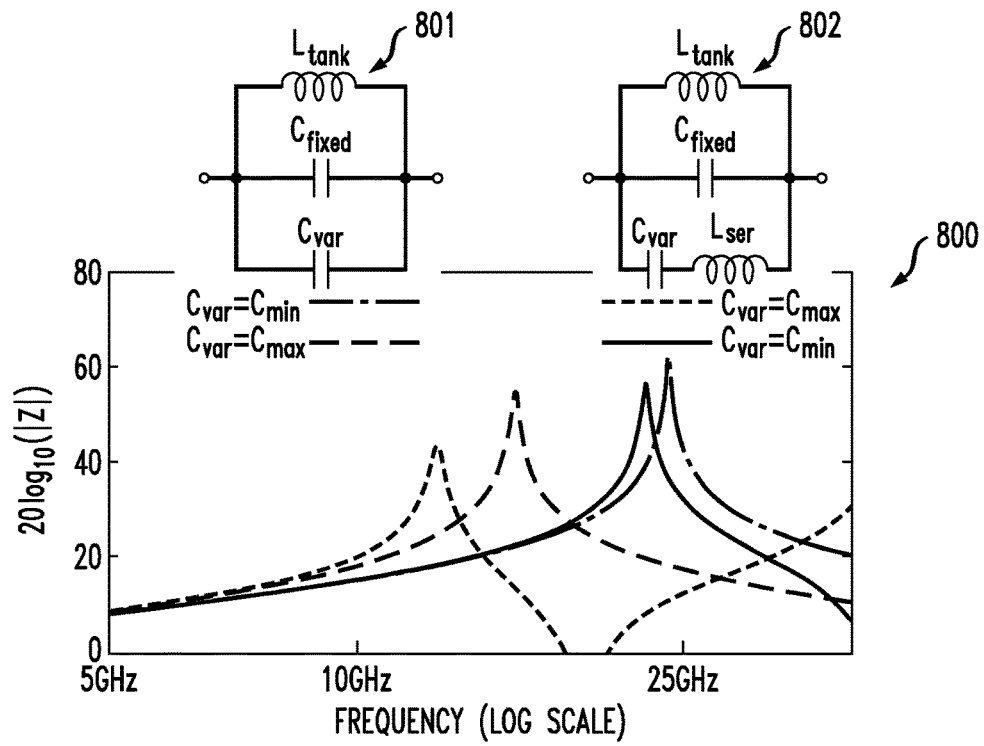
FIG. 8 shows an increased tuning range using capacitance enhancement, according to an embodiment of the invention.

The resonant frequencies for a tank with and without varactor enhancement are plotted in FIG. 8. FIG. 8 shows a plot 800 for a first structure 801 without a series inductance $L_{ser}$ and a second structure with the series inductance $L_{ser}$. As seen from the plot, the series inductance $L_{ser}$ improves the maximum to minimum frequency ratio, $f_{max}/f_{min}$, by about 50%. Thus, as shown, the capacitance enhancement technique allows for a full octave tuning range. In plot 800, the fixed capacitance $C_{fixed}$ is assumed to be approximately equal to the minimum varactor capacitance, and a tank inductor value of 70 pH is assumed.

Figure 9:
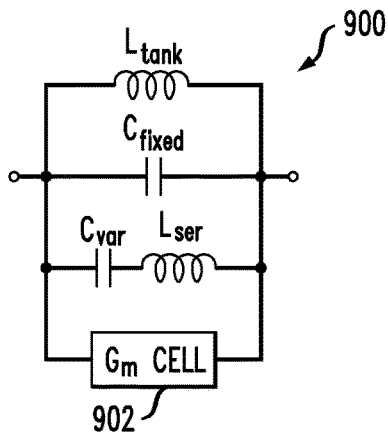
FIG. 9 shows a VCO using a series inductance to boost a capacitance ratio of a varactor, according to an embodiment of the invention.

The introduction of the series inductor that enables the capacitance enhancement and $C_{max}/C_{min}$ ratio versus Q tradeoff also results in making the LC VCO a higher order oscillator. FIG. 9 shows an LC VCO 900, including a tank inductor $L_{tank}$, fixed capacitor $C_{fixed}$, varactor $C_{var}$, series inductor $L_{ser}$ and a negative resistance $G_m$ cell 902. As a result, it is possible for the LC VCO 900 to oscillate in parasitic modes for certain switching combinations. The parasitic modes of oscillation depend on the placement of the negative resistance. If the negative resistance is placed in a lumped location within the LC VCO 900, both the desired and the parasitic modes of oscillation "see" the entire transconductance.

Figure 10:
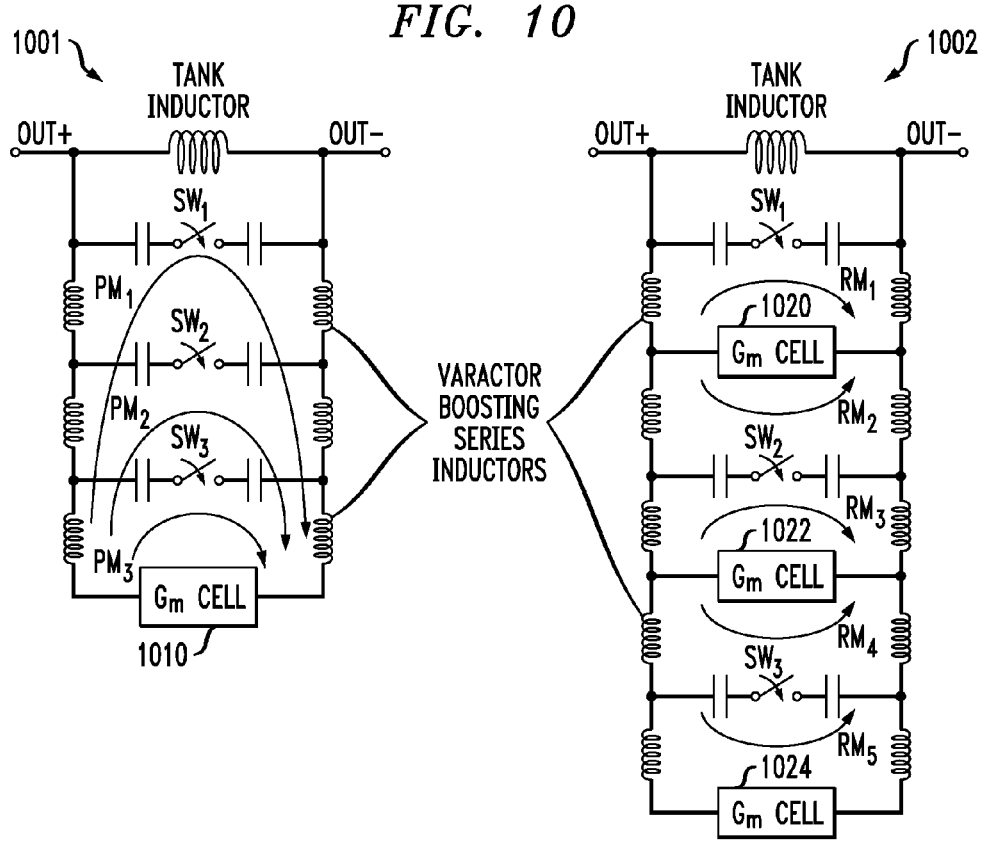
FIG. 10 shows transconductance distribution in resonators including distributed capacitor networks, according to an embodiment of the invention.

This effect is shown in FIG. 10, which shows resonators 1001 and 1002. The resonators 1001 and 1002 are LC circuits, including respective tank inductors and respective sets of switched capacitors. Switches $SW_1$, $SW_2$ and $SW_3$ are used to switch in respective sets of the capacitors. As shown, varactor boosting series inductors are connected in series with respective ones of the switched capacitors, allowing for enhancement of the $C_{max}/C_{min}$ ratio for the switched capacitors. The varactor boosting series inductors, however, contribute to parasitic modes of oscillation. The parasitic modes involve the combinations of the series interconnect inductance and the varactors. Above the self-resonance frequency of these combinations, the effective inductance formed can resonate with the tank capacitance. If the negative resistance element is placed in a lumped location, both the desired and the parasitic modes of oscillation will "see" the entire transconductance. This effect is shown in resonator 1001, which has $G_m$ cell 1010 in a lumped location, resulting in parasitic modes of oscillation $PM_1$, $PM_2$ and $PM_3$.

Different placement of the negative resistance with respect to the tank and the capacitor array can result in the creation of different, multiple potential, parasitic modes of oscillation. In any of these modes, the series combination of the parasitic inductance and the capacitance can form an equivalent inductor that can resonate with other capacitors in the tank. The distribution of the transconductance is a somewhat free layout parameter that can be exploited to support the desired mode and suppress undesired oscillation modes. This is illustrated in resonator 1002, which has multiple $G_m$ cells 1020, 1022 and 1024 distributed throughout the capacitor network of the resonator 1002. This placement limits the ability of the $G_m$ cells 1020, 1022 and 1024 to support parasitic resonance modes. As shown in FIG. 10, the resonator 1002 has parasitic modes of oscillation $RM_1$, $RM_2$, $RM_3$, $RM_4$ and $RM_5$, which leverage only a small portion of the distributed transconductance. Moreover, the parasitic modes $RM_1$, $RM_2$, $RM_3$, $RM_4$ and $RM_5$ are pushed to higher frequencies where the transconductance of the Gm cells 1020, 1022 and 1024 are lower. In this way, the placement causes the parasitic oscillation modes to be heavily damped.

Figure 11:
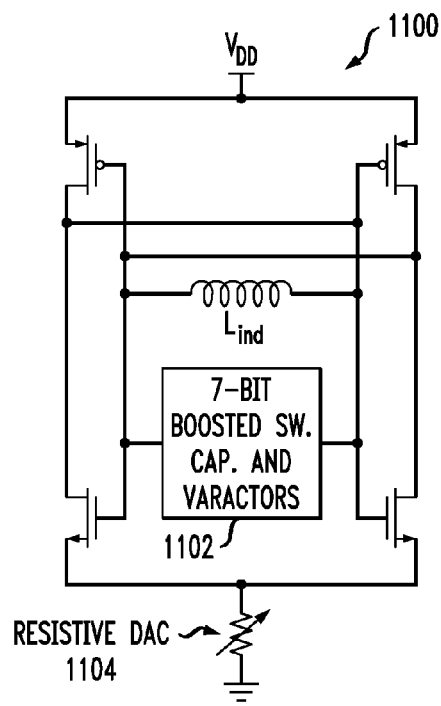
FIG. 11 shows a full octave VCO, according to an embodiment of the invention.
Figure 12:
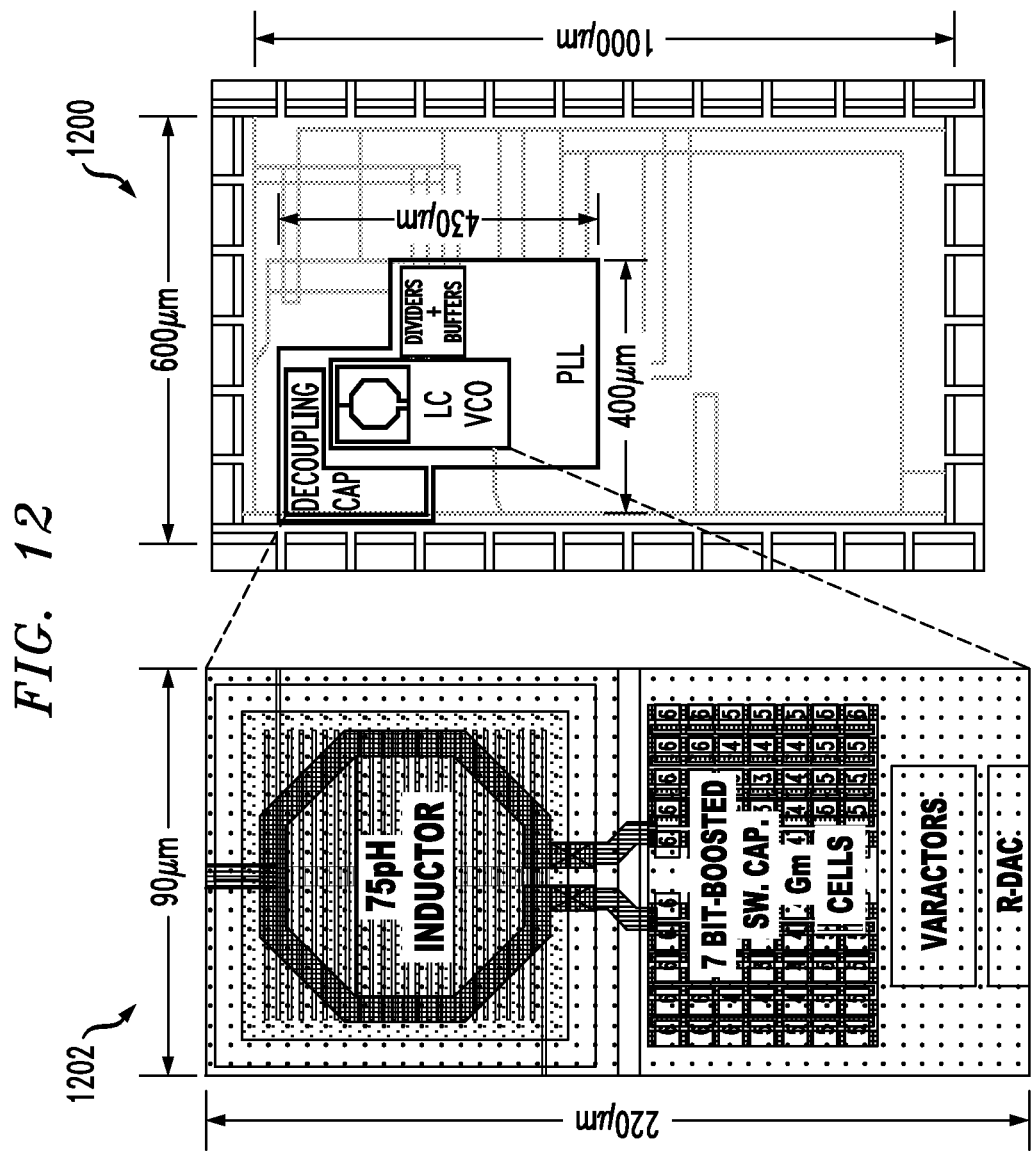
FIG. 12 shows a die micrograph of the full octave VCO of FIG. 11, according to an embodiment of the invention.

FIG. 11 shows a circuit diagram of a full-octave VCO 1100. The full-octave VCO 1100 uses a 7-bit custom-weighted switched capacitors and analog varactors 1102 for tuning. The full-octave VCO 1100 also has tank inductor $L_{ind}$ and resistive DAC 1104. In some embodiments, the switched capacitors may be constructed using a series combination of MOMCAPs and NMOS switches. FIG. 12 shows a die micrograph 1200 of an implementation of the full-octave VCO 1100 in a PLL 1201 using a 32 nm CMOS SOI process. FIG. 12 also shows a detailed view 1202 of an implementation of the full-octave VCO 1100. The tank inductor $L_{ind}$ may be, by way of example, a 75 pH inductor. The switched capacitor array in element 1102 and the inductor $L_{ind}$ occupy similar areas as shown in FIG. 12. As shown, the full-octave VCO 1100 occupies only 220 μm×90 μm=0.2 mm², while the PLL 1201 occupies 430 μm×400 μm=0.17 mm². It should be noted however, that the specific dimensions shown in FIG. 12 are presented by way of example only, and embodiments are not limited to the specific dimensions shown in FIG. 12. In addition, embodiments are not limited to only 7-bit switched capacitor arrays. Instead, switched capacitor arrays of more or fewer than 7 bits may be used in other embodiments.

Interconnect wiring used to connect to the capacitor array in element 1102 is used for capacitance boosting, and as such the capacitive boosting does not require additional area overhead. The values of the series inductance formed using interconnect wiring, as described above, may be controlled in a number of ways including adjusting the length and/or width of the interconnect wiring and controlling mutual inductances by adjusting the distances between different interconnects. Given the frequency dependence of the capacitance, the capacitance and quality factor of the most significant bit (MSB) capacitors in element 1102 are optimized for the frequencies at which they are used.

The $G_m$ cells shown in FIG. 12 may be distributed in a manner similar to that described above with respect to FIG. 10. In some embodiments, the distribution of the $G_m$ cells may be achieved by splitting a lumped $G_m$ cell into two pieces and distributing these pieces across the capacitor array in element 1102.

In some embodiments, the trade-off between phase noise, oscillation frequency and tuning range may be exploited in order to achieve a fairly uniform phase noise across the tuning range of a VCO such as the full-octave VCO 1100. In some embodiments, varactor Q and phase noise performance may improve at lower frequencies. As such, it is possible to sacrifice some of this Q in favor of tuning range without sacrificing phase noise to thereby optimize the varactor array in a frequency aware fashion. To this end, varactors that are utilized only at the lower frequencies (the MSB capacitors in the binary weighted array) may be designed with relatively smaller switches and more aggressive capacitance boosting so as to maintain a substantially constant phase noise across the tuning range.

The switched capacitors in element 1102 may utilize capacitance enhancement techniques described herein to increase the $C_{max}/C_{min}$ ratio of various ones of the switched capacitors. Table 1 below shows the actual and effective normalized capacitances per control bit. In Table 1, the capacitances are normalized to the value of the least significant bit (LSB) switched capacitance (the 1 in the leftmost numerical column in the table). The normalized switch sizes for each switched capacitor are also shown.

TABLE 1

| Actual Capacitance Units | 1 | 1.7 | 2.7 | 5.1 | 9.6 | 17.1 | 24.4 | Σ = 62 |
|---|---|---|---|---|---|---|---|---|
| Effective Capacitance Units | 1 | 2 | 4 | 8 | 16 | 28 | 41 | Σ = 100 |
| Switch Units | 1 | 1 | 2 | 3 | 5 | 8 | 10 | Σ = 30 |

Figure 13:
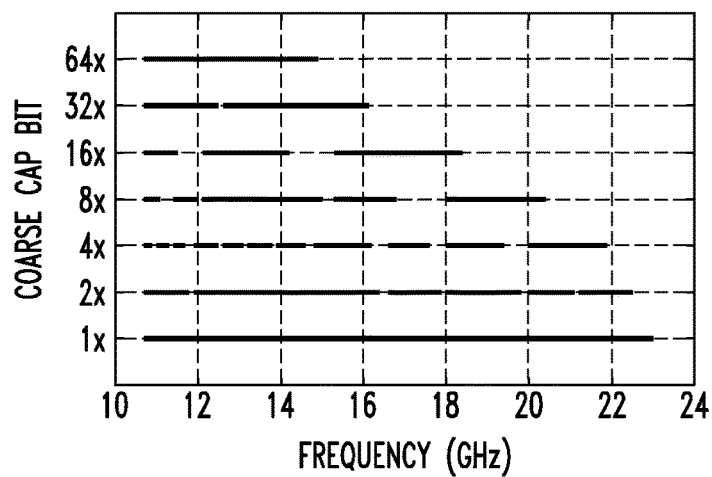
FIG. 13 shows binary weighted capacitor usage across a frequency range, according to an embodiment of the invention.

As seen in Table 1, the effective capacitance is not binary weighted for the two MSBs. This is done in some embodiments in order to reduce the parasitic capacitance contribution from these MSB switch capacitors while still achieving an octave of tuning range. FIG. 13 shows a plot 1300 of the frequency usage of the different capacitors in the 7-bit switched capacitor array of the full-octave VCO 1100. Note that, due to capacitance boosting, only 62 units of capacitance are utilized to produce 100 effective units of capacitance variation in the full-octave VCO 1100. Moreover, the switches contribute only 30 units of parasitic capacitance. In comparison, a binary weighted array with proportional switch sizing would use 100 units of both capacitance and switches, such that the combined parasitic capacitance would make it impossible to achieve an octave tuning range in this technology at the target frequencies.

It is important to note that the values shown in Table 1 are presented by way of example, in other embodiments, different amounts of capacitance enhancement may be used in the 7-bit switched capacitor array and varactor element 1102, including utilizing capacitance enhancement for the two MSBs. Also, as discussed above, embodiments are not limited solely to 7-bit switched capacitor arrays.

By controlling and optimizing the quality factor of the capacitances, a steady phase noise is achieved though the tuning range of the full-octave VCO 1100. Specifically, the tradeoff between phase noise, frequency of oscillation and tuning range may be exploited as described above in some embodiments to achieve an optimal or desired performance.

In some embodiments, the switch sizes are reduced for the MSB capacitors since phase noise improves at lower frequencies.

Figure 14:
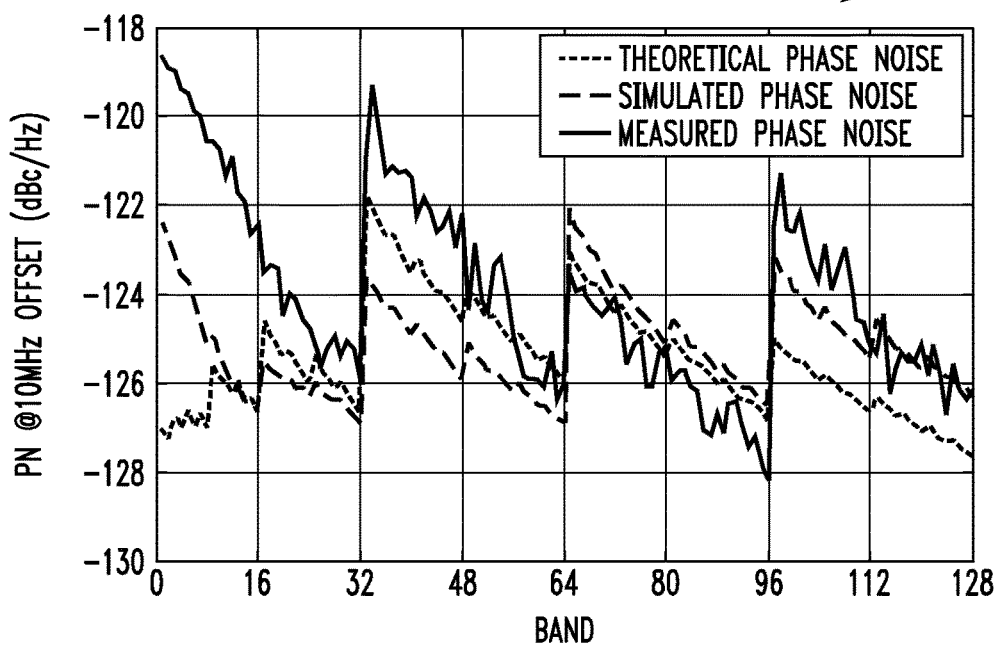
FIG. 14 shows phase noise variation across capacitor bands, according to an embodiment of the invention.

FIG. 14 shows a plot 1400 illustrating phase noise variation across capacitor bands. The phase noise versus capacitor Q optimization is observed by plotting the phase noise across the 7-bit combinations of the full-octave VCO 1100. The simulated Q factor of the tank is scaled in accordance with Leeson's model assuming a fixed signal power and fixed F factor across the tuning range with a 10 MHz offset. The phase noise based on tank Q factor is shown as a dotted line in the plot 1400. This can be compared to the simulated phase noise shown as the dashed line in the plot 1400. The plot 1400 also shows measured phase noise as a solid line. As seen in the plot 1400, the phase noise variation over the tuning range is primarily determined by the Q factor variation. Moreover, the optimization in the capacitor Q factor enables a steady, sawtooth phase noise profile across frequency, which provides good phase noise performance at the highest frequencies and trades off expected phase noise improvements at the lower frequencies to achieve a wider tuning range.

Figure 15:
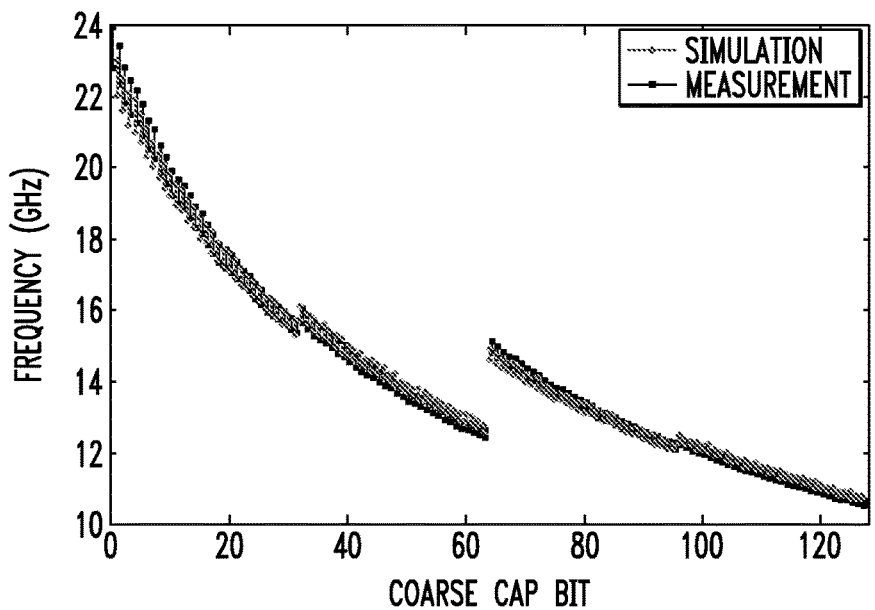
FIG. 15 shows a tuning profile of a full octave VCO, according to an embodiment of the invention.

The tuning curves of the full-octave VCO 1100, both measurement and simulation, for different capacitor bits are shown in plot 1500 in FIG. 15. As shown, the VCO 1100 achieves a tuning range of about 10.5 GHz to about 24 GHz, resulting in more than an octave of tuning range with a significant margin for process, voltage and temperature (PVT) variations. In other embodiments, a VCO, resonator, filter or other type of reconfigurable radio may achieve different tuning ranges using capacitance enhancement techniques as described herein.

Figure 16:
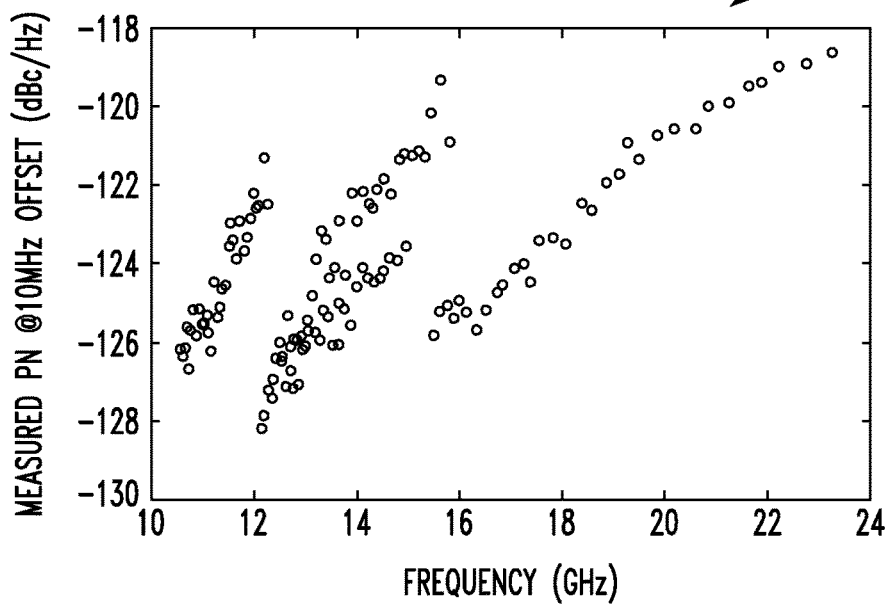
FIG. 16 shows a plot of phase noise across a tuning range of a full octave VCO, according to an embodiment of the invention.

FIG. 16 shows a plot 1600 of the phase noise across the tuning range for the full-octave VCO 1100. As the quality factor of the larger capacitors, e.g., those with series inductor capacitance boosting, is lower, the phase noise drops when the larger capacitors are switched in.

Figure 17:
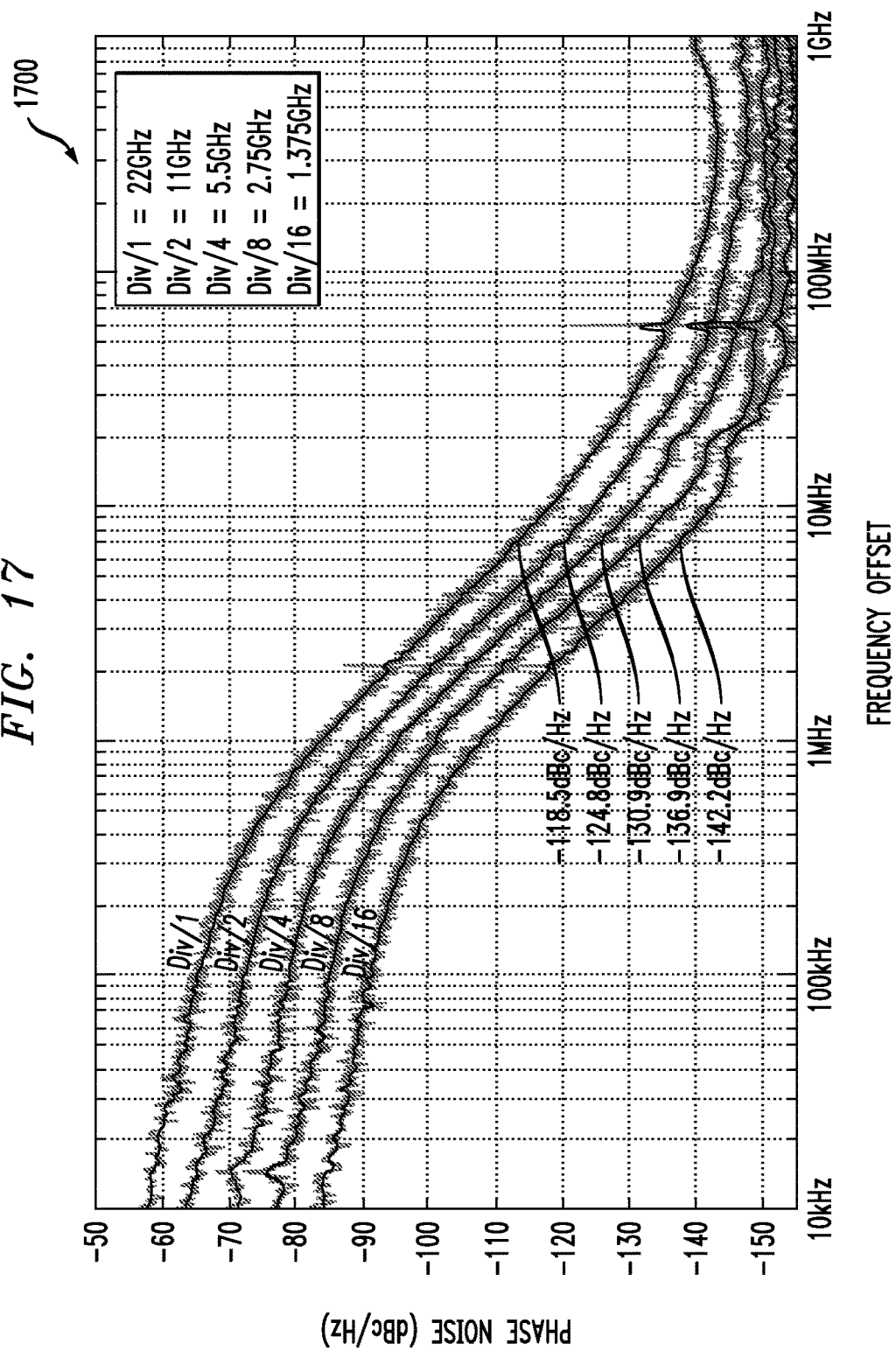
FIG. 17 shows a plot of phase noise versus offset frequency for VCO and divider outputs, according to an embodiment of the invention.

FIG. 17 shows a plot 1700 of the phase noise profiles versus offset frequencies for the fundamental output of the full-octave VCO 1100, along with various divided outputs. The plot 1700 shows the expected 6 dB phase noise improvement for every frequency division by 2. The phase noise varies between −119 dBc/Hz and −128 dBc/Hz across the tuning range. The power dissipation for the full-octave VCO 1100 is less than 20 mW across the tuning range.

As described above with respect to FIG. 12, in some embodiments the full-octave VCO 1100 may be implemented requiring only 0.02 mm$^2$ area, while achieving a 78% tuning range, which is more than an octave (67%) of tuning range. In some embodiments, divide by 2 circuits may be used to achieve frequencies down to 660 MHz. Distributed transconductance approaches may be utilized to avoid parasitic oscillations.

Figure 18:
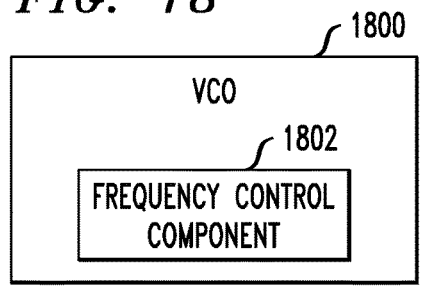
FIG. 18 shows a VCO having a frequency control component, according to an embodiment of the invention.
Figure 19:
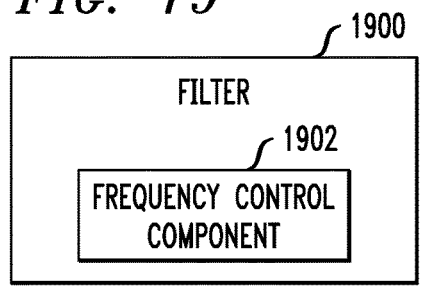
FIG. 19 shows a filter having a frequency control component, according to an embodiment of the invention.
Figure 20:
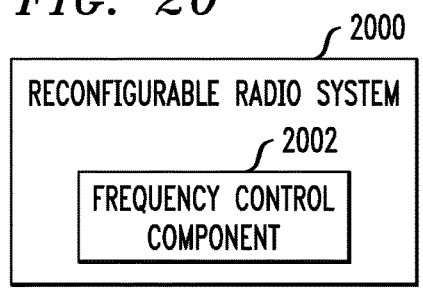
FIG. 20 shows a reconfigurable radio system having a frequency control component, according to an embodiment of the invention.

While various embodiments have been described with respect to the full-octave VCO 1100, the above-described techniques are not limited solely to use with a full-octave VCO. Instead, the above-described techniques may be more generally utilized in a frequency control component comprising at least one varactor and at least one inductor connected in series with the at least one varactor, wherein a magnitude of an inductance of the at least one inductor is selected such that the frequency control component has an effective capacitance range larger than a capacitance range of the at least one varactor. In some embodiments, the at least one inductor may be implemented using interconnect wiring having at least one of a width, a length and a distance from another interconnect wiring selected such that the frequency control component has the effective capacitance range. In other embodiments, the at least one inductor may be implemented using a coil inductor, a variable or tunable inductor, a transmission line, or a variable or tunable transmission line. The at least one varactor may be implemented as an analog varactor, a switched capacitor or an array or network of switched capacitors and/or analog varactors having inductors connected in series with respective ones of one or more of the switched capacitors and/or analog varactors. In some embodiments, a plurality of negative resistance elements spatially distributed within respective distances of the plurality of switched capacitors. Such a frequency control component may be implemented in various types of devices. By way of example, FIGS. 18-20 show a VCO 1800, filter 1900 and reconfigurable radio system 2000 having respective frequency control components 1802, 1902 and 2002, respectively, which utilize the capacitance enhancement techniques described herein. The filter 1900 may be an active or passive filter.

Figure 21:
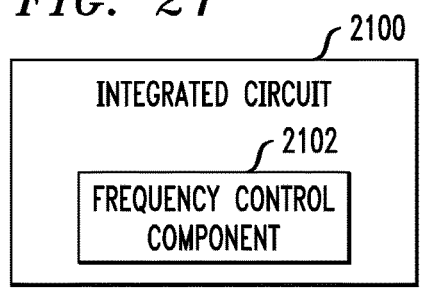
FIG. 21 shows an integrated circuit having a frequency control component, according to an embodiment of the invention.

Various structures described above may be implanted in integrated circuits. FIG. 21 shows an integrated circuit 2100 having a frequency control component 2102. It is to be appreciated that, in an illustrative integrated circuit implementation, one or more integrated circuit dies are typically formed in a pattern on a surface of a wafer. Each such die may include a device comprising circuitry as described herein, and may include other structures or circuits. The dies are cut or diced from the wafer, then packaged as integrated circuits. One ordinarily skilled in the art would know how to dice wafers and package dies to produce packaged integrated circuits. Integrated circuits, manufactured as above and/or in other ways, are considered part of this invention. It is to be understood that circuits in some embodiments can be formed across multiple integrated circuits.

Figure 22:
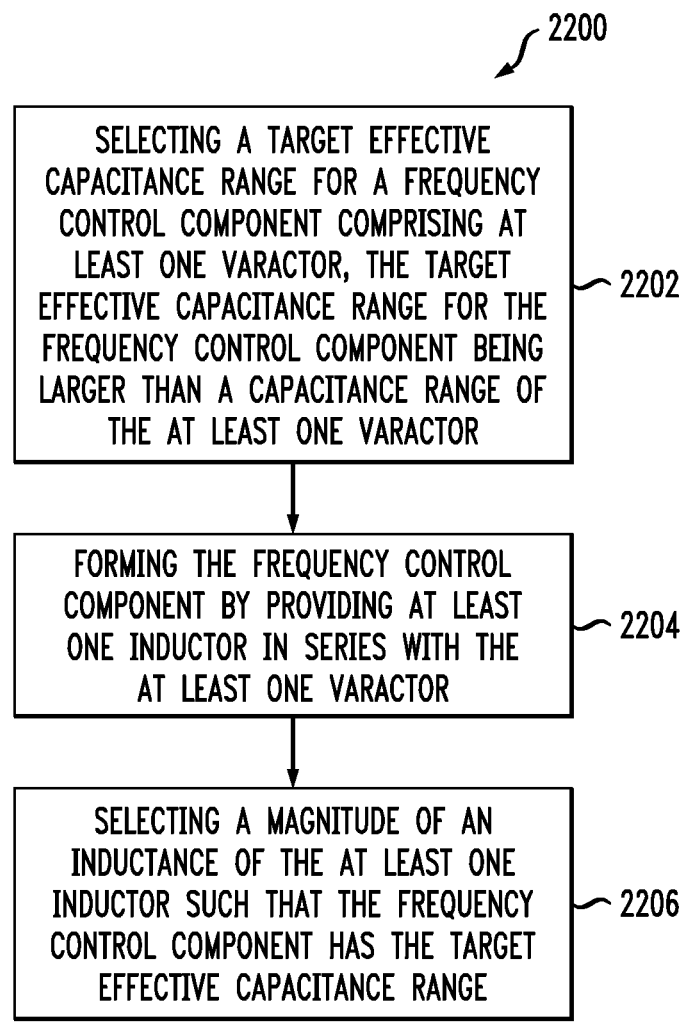
FIG. 22 shows a process for boosting a capacitance range of a varactor, according to an embodiment of the invention.

FIG. 22 shows a process 2200 for boosting a capacitance range of a varactor. The process 2200 includes selecting 2202 a target effective capacitance range for a frequency control component comprising at least one varactor, the target effective capacitance range for the frequency control component being larger than a capacitance range of the at least one varactor. The frequency control components 1802, 1902, 2002 and 2102, as well as the structure 400 and portions of the structures 500, 600, 802, 900, 1001, 1002 and 1100 are example of frequency control components. The at least one varactor may be implemented as an analog varactor, a switched capacitor or an array or network of switched capacitors and/or analog varactors having inductors connected in series with respective ones of one or more of the switched capacitors and/or analog varactors.

The process 2200 continues with forming 2204 the frequency control component by providing at least one inductor in series with the at least one varactor. In some embodiments, the at least one inductor may be implemented using interconnect wiring coupled to the at least one varactor or as an inductor coil. As described above, in some embodiments the at least one varactor may comprises an array of one or more switched capacitors and/or analog varactors. In such embodiments, the step 2204 of forming the frequency control component may further include spatially distributing negative resistance elements within respective distances of the switched capacitors and/or analog varactors.

Process 2200 further includes selecting 2206 a magnitude of an inductance of the at least one inductor such that the frequency control component has the target effective capacitance range. As described above, in some embodiments the at least one inductor may be implemented as interconnect wiring connected to the at least one varactor. In such embodiments, the step 2206 of selecting the magnitude of the inductance of the at least one inductor may comprise adjusting at least one of a length and a width of the interconnect wiring. The step 2206 of selecting the magnitude of the inductance of the at least one inductor may alternately or additionally include adjusting a distance between the interconnect wiring and another interconnect wiring.

As described above, in some embodiments the at least one varactor may comprise a switched capacitor. In such embodiments, the switched capacitor may be a semiconductor switch connected in series with a capacitor having a given quality factor. The process 2200 in these embodiments may further include selecting a size of the semiconductor switch to at least partially compensate for a reduction in the given quality factor resulting from the effective capacitance range of the frequency control component being larger than the capacitance range of the at least one varactor.

It will be appreciated and should be understood that the exemplary embodiments of the invention described above can be implemented in a number of different fashions. Given the teachings of the invention provided herein, one of ordinary skill in the related art will be able to contemplate other implementations of the invention. Indeed, although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A method of manufacturing a frequency control component, comprising:
    forming the frequency control component;
    providing at least one varactor in the frequency control component, the at least one varactor having an associated capacitance range;
    selecting a target effective maximum to minimum capacitance range for the frequency control component, the target effective capacitance range for the frequency control component being larger than the capacitance range of the at least one varactor;
    providing at least one inductor in series with the at least one varactor in the frequency control component;
    selecting a magnitude of an inductance of the at least one inductor such that the frequency control component has the target effective capacitance range; and
    connecting the at least one inductor in series with the at least one varactor such that the frequency control component has the target effective capacitance range;
    wherein selecting the magnitude of inductance of the at least one inductor is based on a quality factor of the at least one varactor.

2. The method of claim 1, wherein the at least one inductor comprises interconnect wiring coupled to the at least one varactor.

3. The method of claim 2, wherein the selecting the magnitude of the inductance of the at least one inductor further comprising adjusting at least one of a length and a width of the interconnect wiring.

4. The method of claim 2, wherein the selecting the magnitude of the inductance of the at least one inductor further comprising adjusting a distance between the interconnect wiring and another interconnect wiring.

5. The method of claim 1, wherein the at least one inductor comprises an inductor coil.

6. The method of claim 1, wherein the at least one inductor comprises a tunable inductor.

7. The method of claim 1, wherein the at least one inductor comprises a transmission line.

8. The method of claim 1, wherein the at least one inductor comprises a tunable transmission line.

9. The method of claim 1, wherein the at least one varactor comprises an analog varactor.

10. The method of claim 1, wherein the at least one varactor comprises a plurality of switched capacitors and wherein the at least one inductor comprises a plurality of inductors connected in series with respective ones of the plurality of switched capacitors.

11. The method of claim 1, wherein the at least one varactor comprises a switched capacitor comprising a semiconductor switch connected in series with a capacitor having a given quality factor and further comprising selecting a size of the semiconductor switch to at least partially compensate for a reduction in the given quality factor resulting from the effective capacitance range of the frequency control component being larger than the capacitance range of the at least one varactor.

12. The method of claim 1, wherein:
    providing at least one varactor in the frequency control component comprises providing two or more varactors in the frequency control component; and
    providing at least one inductor in series with the at least one varactor in the frequency control component comprises providing a first inductor connected in series with a first one of the two or more varactors and providing a second inductor connected in series with a second one of the two or more varactors.

13. The method of claim 12, wherein selecting the target maximum to minimum capacitance range for the frequency control component comprises selecting the target effective capacitance range to be larger than a capacitance range of the two or more varactors.

14. The method of claim 13, wherein selecting the magnitude of the inductance of the at least one inductor comprises selecting magnitudes of inductance of the first inductor and the second inductor such that the frequency control component has the target effective capacitance range larger than the capacitance range of the two or more varactors.

15. The method of claim 14, wherein selecting the magnitudes of inductance of the first inductor and the second inductor is based on quality factors of the first varactor and the second varactor, respectively.

16. The method of claim 15, further comprising providing a plurality of negative resistance elements in the frequency control component within respective distances of respective ones of the two or more varactors.

17. The method of claim 1, further comprising providing the frequency control component in at least one of a voltage controlled oscillator, a filter and a reconfigurable radio system.

18. The method of claim 1, wherein the frequency control component controls an oscillation frequency.

19. The method of claim 18, wherein the oscillation frequency has a tuning range greater than one octave natively.

20. The method of claim 18, wherein the tuning range extends between 10.5 GHz and 24 GHz.

\* \* \* \* \*